United States Patent
Kong et al.

(10) Patent No.: US 7,936,205 B2
(45) Date of Patent: May 3, 2011

(54) LEAKAGE REDUCTION IN ELECTRONIC CIRCUITS

(75) Inventors: Xiaohua Kong, San Diego, CA (US);
Lew G. Chua-Eoan, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 19 days.

(21) Appl. No.: 12/486,159

(22) Filed: Jun. 17, 2009

(65) Prior Publication Data

US 2010/0321102 A1 Dec. 23, 2010

(51) Int. Cl.
*H03K 3/01* (2006.01)
(52) U.S. Cl. .................. 327/534; 327/535; 327/537
(58) Field of Classification Search ............... 327/530, 327/534–538, 540, 541, 543, 544
See application file for complete search history.

(56) References Cited

U.S. PATENT DOCUMENTS

| | | | |
|---|---|---|---|
| 6,191,623 B1 * | 2/2001 | Gabara | 327/71 |
| 6,559,708 B2 * | 5/2003 | Notani | 327/537 |
| 6,741,098 B2 * | 5/2004 | Takahashi et al. | 326/81 |
| 6,864,708 B2 * | 3/2005 | Takahashi et al. | 326/33 |
| 6,933,744 B2 * | 8/2005 | Das et al. | 326/17 |
| 6,952,113 B2 * | 10/2005 | Brown et al. | 326/33 |
| 2003/0025130 A1 | 2/2003 | Takahashi | |
| 2005/0162211 A1 | 7/2005 | Ryu | |
| 2006/0145752 A1 * | 7/2006 | Kim | 327/544 |
| 2006/0226493 A1 | 10/2006 | Chuang | |
| 2007/0152706 A1 | 7/2007 | Seo | |
| 2007/0176233 A1 | 8/2007 | Ozawa | |

OTHER PUBLICATIONS

International Search Report—PCT/ US2010/039072, International Search Authority—European Patent Office Oct. 1, 2010.
Written Opinion—PCT/ US2010/039072, International Search Authority—European Patent Office Oct. 1, 2010.

* cited by examiner

*Primary Examiner* — Lincoln Donovan
*Assistant Examiner* — Brandon S Cole
(74) *Attorney, Agent, or Firm* — Sam Talpalatsky; Nicholas J. Pauley; Jonathan T. Velasco

(57) ABSTRACT

In one embodiment, an apparatus for reducing leakage in an electronic circuit (e.g., a CMOS circuit) includes a power switch transistor configured to selectively couple or decouple a voltage to a logic portion of the electronic circuit. The power switch transistor receives a first voltage during an active mode of the electronic circuit and receives a second voltage during a sleep mode of the electronic circuit. The power switch transistor has a bulk region that is biased using the first voltage during sleep mode. The power switch transistor has a gate region that is biased using the first voltage during sleep mode.

60 Claims, 4 Drawing Sheets

LEAKAGE REDUCTION IN ELECTRONIC CIRCUITS

FIELD OF DISCLOSURE

Disclosed embodiments relate generally to electronic circuits, and more specifically to techniques for reducing leakage current in electronic circuits, such as complementary metal oxide semiconductor (CMOS) circuits.

BACKGROUND

As integrated circuit (IC) fabrication technology improves, the size of transistors tends to shrink. This enables more transistors and more complicated circuits to be fabricated on an IC die or, alternatively, a smaller die to be used for a given circuit. Smaller transistor size also supports faster operating speed and provides other benefits.

For CMOS technology, which is widely used for digital circuits and some analog circuits, a major issue with shrinking transistor size is sleep mode (or standby) power. Smaller transistor geometry results in higher electric fields, which stresses a transistor and causes oxide breakdown. To decrease the electric fields, a lower power supply voltage is often used for smaller geometry transistors. Unfortunately, the lower power supply voltage also increases the delay of the transistors from state to state, which is undesirable for high-speed circuits. To reduce the delay and improve operating speed, the threshold voltage (Vt) of the transistors is reduced. The threshold voltage determines the voltage at which the transistors turn on. However, the lower threshold voltage and smaller transistor geometry result in higher leakage current, which is the current passing through a transistor when it is turned off.

Leakage current becomes more problematic as CMOS technology scales smaller because leakage current increases at a higher rate with respect to the decrease in transistor size. Moreover, leakage current is a major issue for certain applications such as portable devices (e.g., cellular phone and portable computer). Leakage current consumes power and reduces standby time for portable devices that use battery power.

Reducing leakage current without significantly sacrificing performance is one of the major challenges in CMOS designs, especially as IC technology scales down to the 90 nm (nanometer) range and smaller. One common method of combating high leakage current in large CMOS circuit designs is to cut-off power to a CMOS circuit when it is turned off. Power may be cut off with a headswitch, a footswitch, or both. A headswitch is a switch placed between a power supply and the CMOS circuit. A footswitch is a switch placed between the CMOS circuit and circuit ground.

FIG. 1 illustrates an IC using a conventional power cut-off design including a headswitch and a footswitch.

As shown, the IC provides a global VDD power rail 110 and a global VSS ground rail 120. The IC further includes an IC logic portion 150 (e.g., a memory unit, a processor, etc.). IC logic 150 includes its own local VDD power rail 115 and local VSS ground rail 125, which are coupled to global VDD power rail 110 and global VSS ground rail 120, respectively. Local VDD power rail 115 is coupled to global VDD power rail 110 via a headswitch 130, and local VSS ground rail 125 is coupled to global VSS ground rail 120 via a footswitch 140. As discussed above, it may be advantageous for the IC to enter a sleep mode to conserve power, whereby the head and foot switches can be used to isolate the global and local rails, as is well known in the art. Conventionally, headswitch 130 may be a PMOS transistor or the like, and footswitch 140 may be an NMOS transistor or the like. The headswitch 130 and footswitch 140 operation is controlled by an enable en signal, which may be provided by a system controller or the like (not shown). In FIG. 1, the enable en signal is high when the IC is in an active mode (normal operation) and low when the IC is in a sleep mode (standby operation). It will be appreciated that designation of active and sleep modes based on the enable en signal is arbitrary, and the designation can be reversed with relatively minor changes to the design of FIG. 1.

A dual-Vt CMOS technology, as provided for by the IC of FIG. 1, allows for fabrication of both low threshold voltage (low-Vt) and high threshold voltage (high-Vt) field effect transistor (FET) devices on the same IC die. Since speed is not critical for head and foot switches, these switches (e.g., headswitch 130 and footswitch 140) may be implemented with high-Vt FET devices to reduce leakage current. The CMOS circuit (e.g., IC logic portion 150) is implemented with low-Vt FET devices for high-speed operation. During normal operation, the switches are turned on and the CMOS circuit operates with the speed advantage of the low-Vt FET devices. In sleep mode, the switches are turned off and the CMOS circuit is disabled. Since the leakage current of a high-Vt FET device may be as much as 10 to 100 times less than the leakage current of a low-Vt FET device, leakage current of the CMOS circuit is reduced by the use of high-Vt FET devices for the switches.

The method described above for reducing leakage current (i.e., with high-Vt FET devices for the power switches and low-Vt FET devices for the CMOS circuit) is adequate for some CMOS circuits. Nevertheless, even the reduced leakage current provided by the conventional designs described above may not be sufficient for certain applications.

SUMMARY

The disclosed embodiments are directed to circuits, systems, and methods for reducing leakage current in electronic circuits, such as complementary metal oxide semiconductor (CMOS) circuits.

Accordingly, one embodiment includes an apparatus for reducing leakage in an electronic circuit. The apparatus includes a power switch transistor configured to selectively couple or decouple a voltage to a logic portion of the electronic circuit. The power switch transistor receives a first voltage during an active mode of the electronic circuit and receives a second voltage during a sleep mode of the electronic circuit. The power switch transistor has a bulk region that is biased using the first voltage during sleep mode. The power switch transistor has a gate region that is biased using the first voltage during sleep mode.

Another embodiment includes a method of reducing leakage in an electronic circuit. The method includes supplying a first voltage to a power switch transistor during an active mode of the electronic circuit and a second voltage to the power switch transistor during a sleep mode of the electronic circuit. The power switch transistor selectively couples or decouples a voltage to a logic portion of the electronic circuit. The method further includes biasing a bulk region of the power switch transistor using the first voltage during sleep mode and biasing a gate region of the power switch transistor using the first voltage during sleep mode.

Another embodiment includes an apparatus for reducing leakage in an electronic circuit. The apparatus includes means for supplying a first voltage to a power switch transistor during an active mode of the electronic circuit and a second voltage to the power switch transistor during a sleep mode of the electronic circuit. The power switch transistor selectively couples or decouples a voltage to a logic portion of the electronic circuit. The apparatus further includes means for biasing a bulk region of the power switch transistor using the first voltage during sleep mode and means for biasing a gate region of the power switch transistor using the first voltage during sleep mode.

Another embodiment includes a method of reducing leakage in an electronic circuit. The method includes a step for supplying a first voltage to a power switch transistor during an active mode of the electronic circuit and a second voltage to the power switch transistor during a sleep mode of the electronic circuit. The power switch transistor selectively couples or decouples a voltage to a logic portion of the electronic circuit. The method further includes a step for biasing a bulk region of the power switch transistor using the first voltage during sleep mode and a step for biasing a gate region of the power switch transistor using the first voltage during sleep mode.

BRIEF DESCRIPTION OF THE DRAWINGS

The accompanying drawings are presented to aid in the description of embodiments and are provided solely for illustration of the embodiments and not limitation thereof.

DETAILED DESCRIPTION

Figure 1:
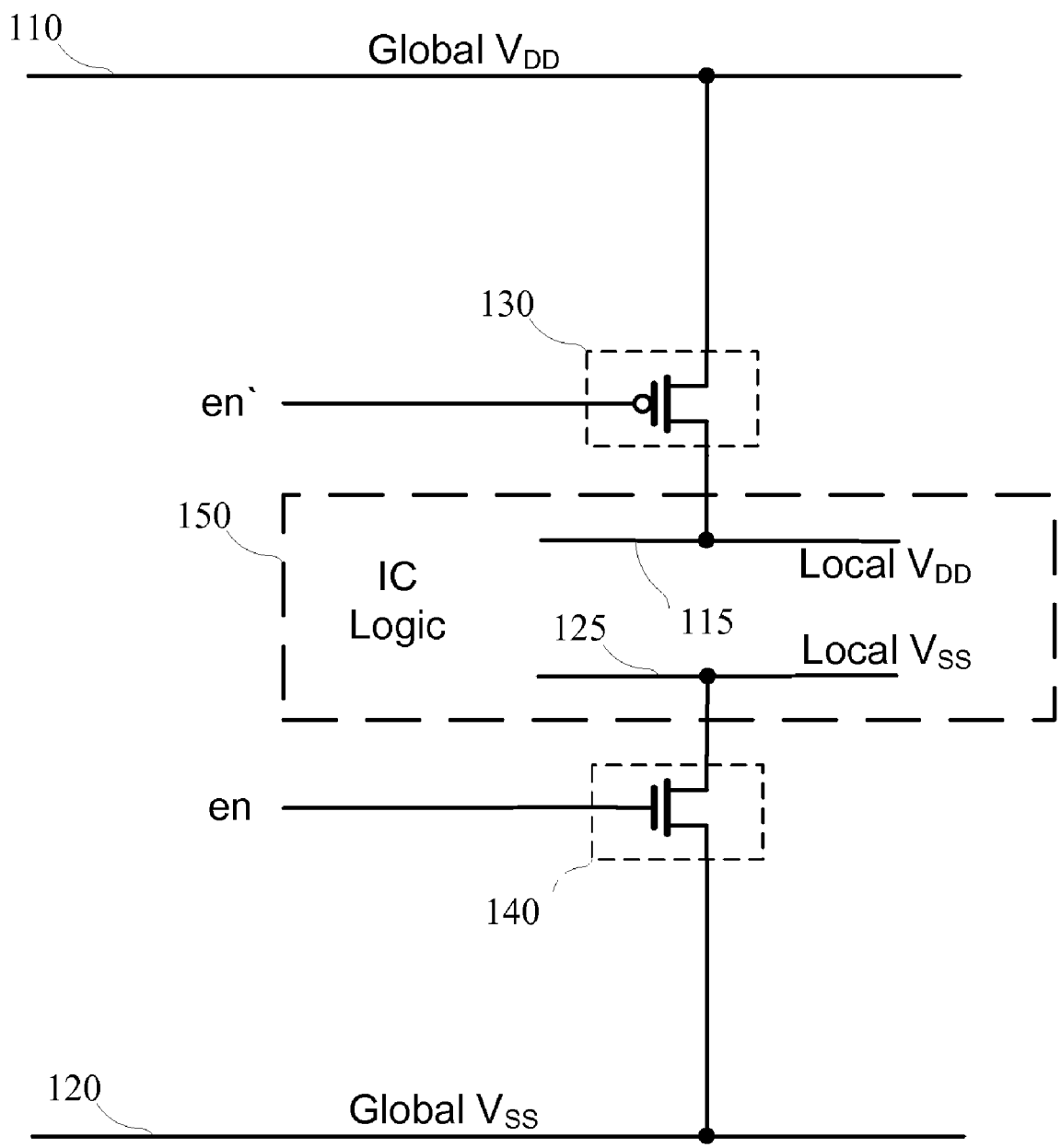
FIG. 1 illustrates an IC using a conventional power cut-off design including a headswitch and a footswitch.

Aspects of the embodiments are disclosed in the following description and related drawings directed to such embodiments. Alternate embodiments may be devised without departing from the scope of the invention. Additionally, well-known elements of the embodiments will not be described in detail or will be omitted so as not to obscure the relevant details.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation. Additionally as used herein a headswitch is a transistor positioned between the local high voltage source and system high voltage source (e.g. supply voltage/ VDD). A footswitch is a transistor positioned between the local ground or low voltage and the system ground or low voltage source (e.g., VSS).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

As discussed in the background, conventional headswitch and footswitch power control schemes can be used to reduce power consumption in a sleep mode. However, even the reduced leakage current provided by the conventional schemes may not be sufficient for certain applications. Accordingly, embodiments provide for additional leakage current control to further reduce leakage current and therefore power consumption during sleep mode of an electronic circuit, such as a complementary metal oxide semiconductor (CMOS) circuits.

Figure 2A:
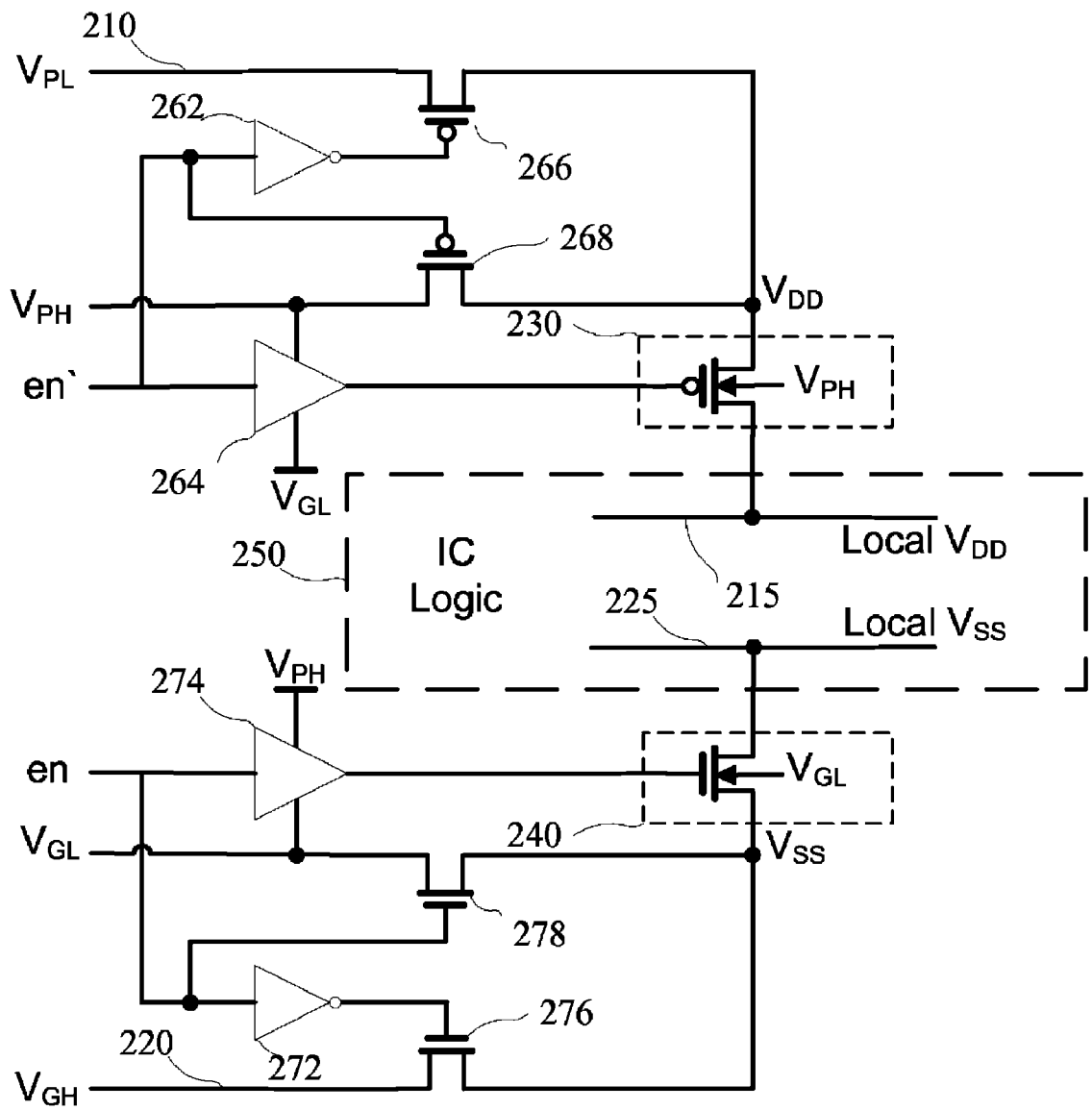
FIG. 2A illustrates an IC using a power cut-off design including a headswitch and a footswitch according to an embodiment.

FIG. 2A illustrates an IC using a power cut-off design including a headswitch and a footswitch according to an embodiment.

As shown, similar to the conventional design of FIG. 1, the IC of FIG. 2A includes an IC logic portion 250 operating according to a local VDD power rail 215 and a local VSS ground rail 225. It will be understood that the terms 'power' and 'ground' rails are used herein to connote only relative voltage levels. For example, a voltage level referred to as a ground voltage level need not be at 0V unless explicitly stated. Local VDD power rail 215 is coupled to an external (relative to IC logic 250) VDD power node via a headswitch 230, and local VSS ground rail 225 is coupled to an external VSS ground node via a footswitch 240. As in the conventional design of FIG. 1, headswitch 230 may be a PMOS transistor or the like, and footswitch 240 may be an NMOS transistor or the like. As will be described in more detail below, the external VDD and VSS nodes can provide IC logic 250 with appropriate power and ground voltage levels when in active mode, and can be adjusted to reduce leakage current during sleep mode, according to various embodiments.

Unlike the conventional design of FIG. 1, on the headswitch side of IC logic 250 (i.e., the power supply side), the IC of FIG. 2A further includes circuitry to selectively couple or decouple a first relatively high power supply voltage $V_{PH}$ (e.g., 1.1V) or a second relatively low power supply voltage $V_{PL}$ (e.g., 0.8V) to the VDD node. Specifically, as illustrated in FIG. 2A, $V_{PL}$ is coupled through a PMOS transistor 266 to the VDD node, and $V_{PH}$ is coupled through a PMOS transistor 268 to the VDD node. The gate of PMOS transistor 266 is controlled by a complement enable en' signal, and the gate of PMOS transistor 268 is controlled by the complement enable en' signal provided through an inverter 262. Accordingly, $V_{PH}$ and $V_{PL}$ are alternately coupled to the VDD node, one at a time, based on the complement enable en' signal.

The complement enable en' signal is further coupled to the gate of the headswitch 230 PMOS transistor through a buffer 264. Buffer 264 receives power (e.g., $V_{PH}$) and ground (e.g., $V_{GL}$) voltages and mirrors an input digital value at the output using the provided power and ground voltages. In this design, the headswitch 230 PMOS transistor has its bulk actively biased by $V_{PH}$, which will be explained in more detail later.

Similar to the headswitch side of IC logic 250, on the footswitch side of IC logic 250 (i.e., the ground supply side), the IC of FIG. 2A further includes circuitry to selectively couple or decouple a first relatively low ground voltage $V_{GL}$ (e.g., 0.0V) or a second relatively high ground voltage $V_{GH}$ (e.g., 0.3V) to the VSS node. Specifically, as illustrated in FIG. 2A, $V_{GL}$ is coupled through an NMOS transistor 278 to the VSS node, and $V_{GH}$ is coupled through an NMOS transistor 276 to the VSS node. The gate of NMOS transistor 278 is controlled by the enable en signal, and the gate of NMOS transistor 276 is controlled by the enable en signal provided through an inverter 272. Accordingly, $V_{GH}$ and $V_{GL}$ are alternately coupled to the VSS node, one at a time, based on the enable en signal.

The enable en signal is further coupled to the gate of the footswitch 240 NMOS transistor through a buffer 274. Buffer 274 receives power (e.g., $V_{PH}$) and ground (e.g., $V_{GL}$) voltages and mirrors an input digital value at the output using the provided power and ground voltages. In this design, the footswitch 240 NMOS transistor also has its bulk actively biased by $V_{GL}$, which will also be explained in more detail later.

The enable en signal and the complement enable en' signal may be provided by a system controller or the like (not shown). In the design of FIG. 2A, the designation of the enable en signal and the complement enable en' signal is derived from the convention that the enable en signal being high designates when the IC is in an active mode (normal operation), and the enable en signal being low designates when the IC is in a sleep mode (standby operation). It will be appreciated that designation of active and sleep modes based on the enable en signal can be reversed, with minor appropriate changes to their application in the design of FIG. 2A. Further, it will be appreciated that the supply voltage and ground levels described above (i.e., $V_{PH}$, $V_{PL}$, $V_{GH}$, and $V_{GL}$) can be provided from pre-existing rails within the IC of FIG. 2A, or may be provided by other external connections.

Active Mode

In active mode, the enable en signal is high. Accordingly, transistors 268 and 278 are turned on, supplying $V_{PH}$ and $V_{GL}$ to the external VDD and VSS nodes, respectively. Furthermore, the enable en signal being high turns on both the headswitch 230 (through buffer 264) and the footswitch 240 (through buffer 274). Therefore, in active mode, the local VDD and VSS rails of the IC logic portion 250 receive $V_{PH}$ and $V_{GL}$, respectively. In essence, active mode allows normal operation of logic 250 by coupling the local VDD and VSS rails to their desired values.

Sleep Mode

In sleep mode, the enable en signal is low. Accordingly, transistors 266 and 276 are turned on, supplying $V_{PL}$ and $V_{GH}$ to the external VDD and VSS nodes, respectively. Furthermore, the enable en signal being high drives buffer 264 to provide $V_{PH}$ to the gate of the headswitch 230 PMOS transistor, and drives buffer 274 to provide $V_{GL}$ to the gate of the footswitch 240 PMOS transistor. Furthermore, the headswitch 230 PMOS transistor's bulk remains biased at $V_{PH}$, and the footswitch 240 NMOS transistor's bulk remains biased at $V_{GL}$. The gate-to-source ($V_{gs}$) biasing conditions and the bulk-to-source ($V_{bs}$) biasing conditions provided in sleep mode by the design of FIG. 2A lead to a reduction in leakage current.

As an example, consider the case in sleep mode where $V_{PH}$ is provided at 1.1V, $V_{PL}$ is provided at 0.8V, $V_{GH}$ is provided at 0.3V, and $V_{GL}$ is provided at 0.0V. Here, the $V_{gs}$ of the headswitch 230 PMOS transistor is $V_{gs}=0.3V$. The $V_{bs}$ of the headswitch 230 PMOS transistor is $V_{bs}=0.3V$. The $V_{gs}$ of the footswitch 240 NMOS transistor is $V_{gs}=-0.3V$. The $V_{bs}$ of the footswitch 240 NMOS transistor is $V_{bs}=-0.3V$.

Accordingly, the design of FIG. 2A provides three distinct mechanisms by which leakage current through the power switches 230 and 240 are reduced. By scaling the supply voltage to a lower voltage level and scaling the ground voltage level to a higher level during sleep mode, the overall voltage drop seen across the IC logic 250 is reduced and therefore the leakage current is also reduced. By providing an active gate bias as compared to the source to each of the power switches 230 and 240 during sleep mode, the $V_{gs}$ seen at each power switch 230 and 240 is reverse biased as compared to their active mode states, which also reduces leakage current. Furthermore, by providing bulk biasing equal to the gate biasing, the efficiency of the power switch is increased and leakage current reduced even further. An active bulk bias as compared to the source additionally creates a body effect on each of the power switches 230 and 240 during sleep mode.

Figure 2B:
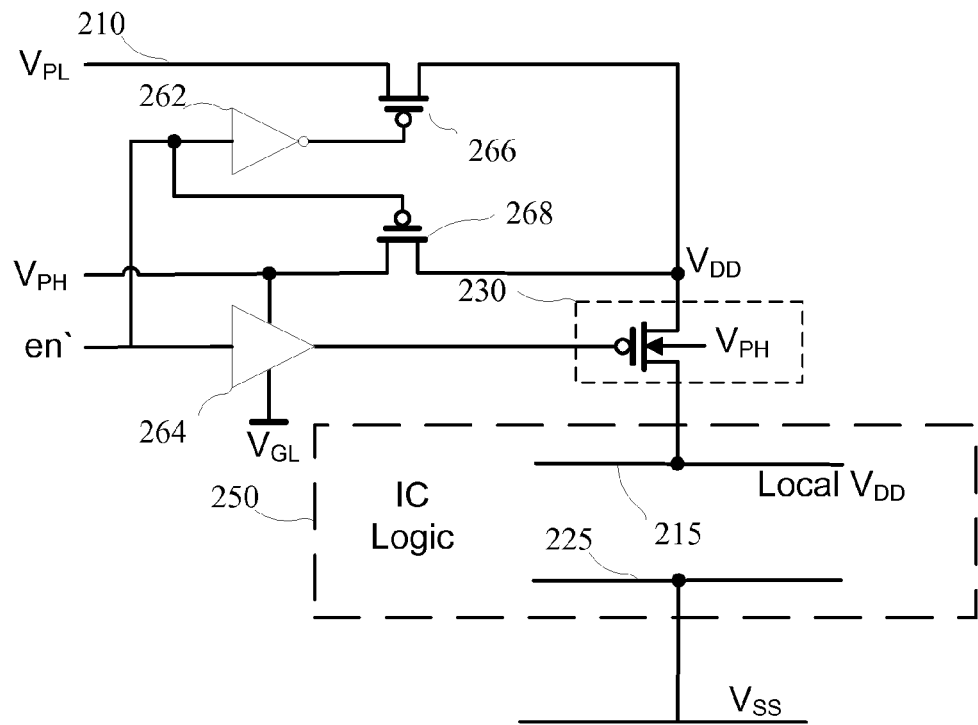
FIG. 2B illustrates an IC using a power cut-off design including a headswitch alone according to another embodiment.
Figure 2C:
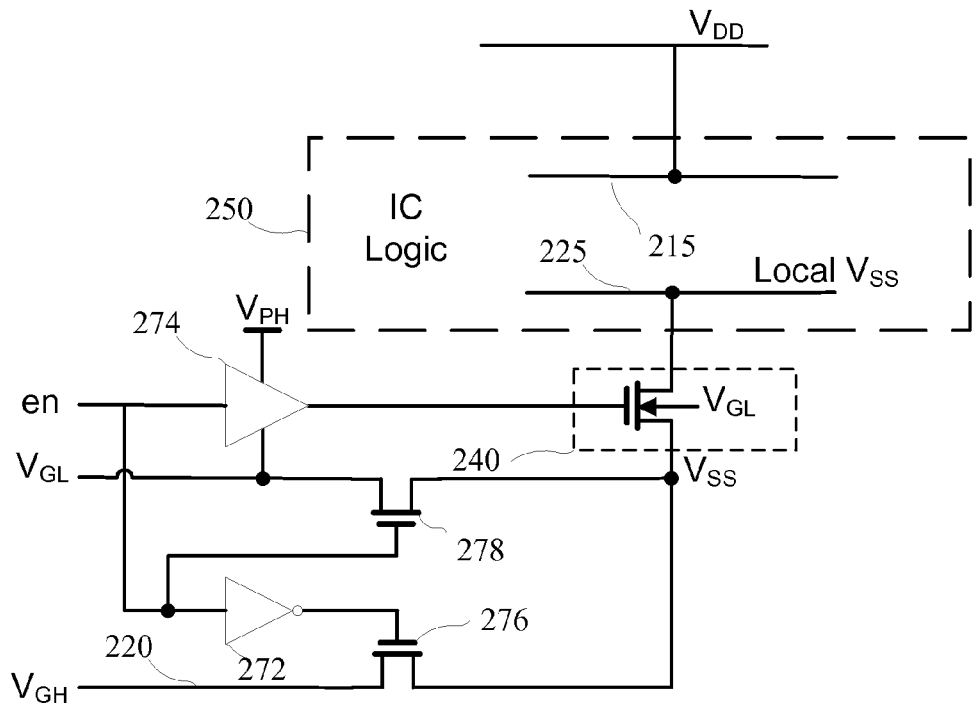
FIG. 2C illustrates an IC using a power cut-off design including a footswitch alone according to another embodiment

It will appreciated that the leakage current reduction techniques applied to the head and foot switches may, but need not be, used in tandem. For example, FIG. 2B illustrates an IC using a power cut-off design including a headswitch alone according to one embodiment, whereas FIG. 2C illustrates an IC using a power cut-off design including a footswitch alone according to another embodiment. Thus, the techniques described herein for reducing leakage in a CMOS device may be applied to headswitch 230 alone (FIG. 2B), footswitch 240 alone (FIG. 2C), or headswitch 230 and footswitch 240 in combination (FIG. 2A).

Figure 3:
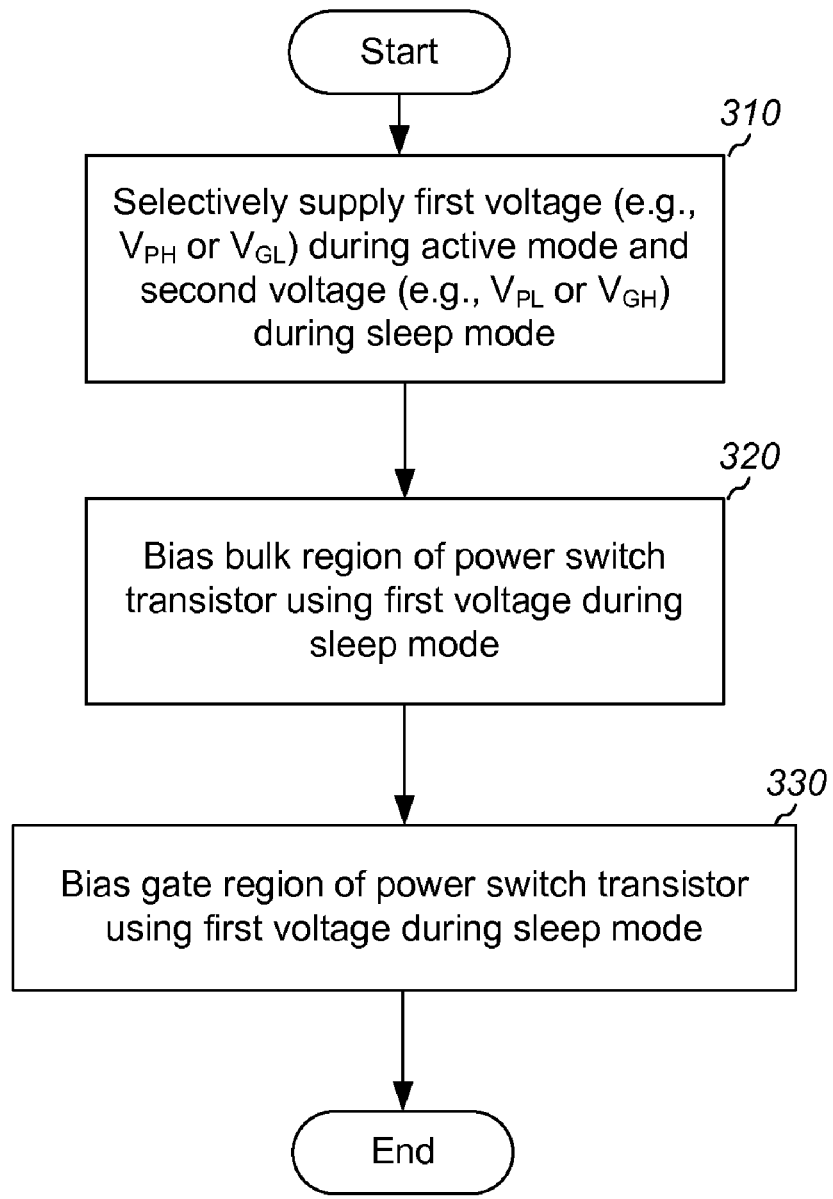
FIG. 3 is a flow diagram illustrating a method of reducing leakage in a CMOS circuit.

In view of the foregoing, it will be appreciated that embodiments can include methods for performing the functions, sequence of actions and/or algorithms described herein. For example, FIG. 3 is a flow diagram illustrating a method of reducing leakage in a CMOS circuit. As shown, a first voltage (e.g., $V_{PH}$ or $V_{GL}$) is supplied to a power switch transistor during an active mode of the CMOS circuit and a second voltage (e.g., $V_{PL}$ or $V_{GH}$) is supplied to the power switch transistor during a sleep mode of the CMOS circuit (block 310). In one embodiment, an enable signal is generated indicating whether the CMOS circuit is in active mode or sleep mode. In this case, the first and second voltages are selectively supplied to the power switch transistor in accordance with the enable signal. A bulk region of the power switch transistor is biased using the first voltage during sleep mode (block 320), and a gate region of the power switch transistor is biased using the first voltage during sleep mode (block 330). The first and second voltages are supplied to a source region of the power switch transistor. In the case where an enable signal is generated, biasing the gate region of the power switch transistor may include providing the enable signal to a buffer and the buffer providing the first voltage to the power switch transistor gate region. In one embodiment, the first voltage is a higher voltage than the second voltage, whereas in another embodiment the first voltage is a lower voltage than the second voltage.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The leakage reductions circuits such as illustrated in FIGS. 2A-2C may be used to reduce leakage current in a variety of devices. For example, the devices may be mobile phones, hand-held personal communication systems (PCS) units, portable data units such as personal data assistants, GPS enabled devices, navigation devices, settop boxes, music players, video players, entertainment units, fixed location data units such as meter reading equipment, or any combination thereof. Although FIGS. 2A-2C illustrates leakage reductions circuits according to the teachings of the disclosure, the disclosure is not limited to these exemplary illustrated configurations. Embodiments of the disclosure may be suitably employed in any device with transistors and other active components.

The foregoing disclosed devices and methods can be configured into GDSII and GERBER computer files, stored on a computer readable media. These files are in turn provided to fabrication handlers who fabricate devices based on these files. The resulting products are semiconductor wafers that are then cut into semiconductor die and packaged into a semiconductor chip. The chips then may be employed in devices described above.

While the foregoing disclosure shows illustrative embodiments, it should be noted that various changes and modifications could be made herein without departing from the scope of the invention as defined by the appended claims. The functions, steps and/or actions of the method claims in accordance with the embodiments described herein need not be performed in any particular order. Furthermore, although elements of the embodiments may be described or claimed in the singular, the plural is contemplated unless limitation to the singular is explicitly stated.

What is claimed is:

1. An apparatus for reducing leakage in an electronic circuit, comprising:
    a power switch transistor configured to selectively couple or decouple a supply voltage to a logic portion of the electronic circuit, the power switch transistor receiving a first voltage as the supply voltage during an active mode of the electronic circuit and receiving a second voltage as the supply voltage during a sleep mode of the electronic circuit, wherein
    the power switch transistor comprises a bulk region that is configured to be biased using the first voltage during the sleep mode and the active mode, and
    the power switch transistor comprises a gate region that is configured to be biased using the first voltage during the sleep mode.

2. The apparatus of claim 1, wherein the electronic circuit is a CMOS circuit.

3. The apparatus of claim 1, wherein the first and second voltages are received at a source region of the power switch transistor.

4. The apparatus of claim 1, wherein the first and second voltages are selectively received by the power switch transistor according to an enable signal indicating whether the electronic circuit is in the active mode or the sleep mode.

5. The apparatus of claim 4, wherein the power switch transistor gate region is biased using a buffer receiving the enable signal and providing the first voltage to the power switch transistor gate region.

6. The apparatus of claim 1, wherein the power switch is a headswitch or a footswitch.

7. The apparatus of claim 1, wherein the first voltage is a higher voltage than the second voltage.

8. The apparatus of claim 1, wherein the first voltage is a lower voltage than the second voltage.

9. The apparatus of claim 1, further comprising:
    a second power switch transistor configured to selectively couple or decouple a second supply voltage to the logic portion of the electronic circuit, the power switch transistor receiving a third voltage during the active mode of the electronic circuit and receiving a fourth voltage during the sleep mode of the electronic circuit, wherein
    the second power switch transistor comprises a second bulk region that is biased using the third voltage during the sleep mode, and
    the power switch transistor comprises a gate region that is biased using the third voltage during the sleep mode.

10. The apparatus of claim 9, wherein the first voltage is a higher voltage than the second voltage, and the third voltage is a lower voltage than the fourth voltage.

11. The apparatus of claim 1, further comprising an electronic device, selected from the group consisting of a set top box, music player, video player, entertainment unit, navigation device, communications device, personal digital assistant (PDA), fixed location data unit, and a computer, into which the apparatus for reducing leakage in an electronic circuit is integrated.

12. The apparatus of claim 1, wherein the first and second voltages are received at a drain region of the power switch transistor.

13. The apparatus of claim 1, wherein at least a part of the apparatus is integrated in a semiconductor die.

14. A method for reducing leakage in an electronic circuit, comprising:
    supplying a first voltage to a power switch transistor during an active mode of the electronic circuit and a second voltage to the power switch transistor during a sleep mode of the electronic circuit, the power switch transistor selectively coupling or decoupling the first voltage or the second voltage to a logic portion of the electronic circuit;
    biasing a bulk region of the power switch transistor using the first voltage during the sleep mode and the active mode; and
    biasing a gate region of the power switch transistor using the first voltage during the sleep mode.

15. The method of claim 14, wherein the electronic circuit is a CMOS circuit.

16. The method of claim 14, wherein the first and second voltages are supplied to a source region of the power switch transistor.

17. The method of claim 14, further comprising generating an enable signal indicating whether the electronic circuit is in the active mode or the sleep mode, the first and second voltages being selectively supplied to the power switch transistor in accordance with the enable signal.

18. The method of claim 17, wherein biasing the gate region of the power switch transistor comprises providing the enable signal to a buffer and the buffer providing the first voltage to the power switch transistor gate region.

19. The method of claim 14, wherein the power switch is a headswitch or a footswitch.

20. The method of claim 14, wherein the first voltage is a higher voltage than the second voltage.

21. The method of claim 14, wherein the first voltage is a lower voltage than the second voltage.

22. The method of claim 14, further comprising:
supplying a third voltage to a second power switch transistor during the active mode of the electronic circuit and a fourth voltage to the power switch transistor during the sleep mode of the electronic circuit, the second power switch transistor selectively coupling or decoupling the third voltage or the fourth voltage to a logic portion of the electronic circuit;
biasing a bulk region of the second power transistor using the third voltage during the sleep mode and the active mode; and
biasing a gate region of the second power transistor using the third voltage during the sleep mode.

23. The method of claim 22, wherein the first voltage is a higher voltage than the second voltage, and the third voltage is a lower voltage than the fourth voltage.

24. The method of claim 14, further comprising applying the method for reducing leakage in an electronic circuit in an electronic device, selected from the group consisting of a set top box, music player, video player, entertainment unit, navigation device, communications device, personal digital assistant (PDA), fixed location data unit, and a computer.

25. The method of claim 14, wherein the first and second voltages are supplied to a drain region of the power switch transistor.

26. An apparatus for reducing leakage in an electronic circuit, comprising:
means for supplying a first voltage to a power switch transistor during an active mode of the electronic circuit and a second voltage to the power switch transistor during a sleep mode of the electronic circuit, the power switch transistor selectively coupling or decoupling the first voltage or the second voltage to a logic portion of the electronic circuit;
means for biasing a bulk region of the power switch transistor using the first voltage during the sleep mode and the active mode; and
means for biasing a gate region of the power switch transistor using the first voltage during the sleep mode.

27. The apparatus of claim 26, wherein the electronic circuit is a CMOS circuit.

28. The apparatus of claim 26, wherein the first and second voltages are supplied to a source region of the power switch transistor.

29. The apparatus of claim 26, further comprising means for generating an enable signal indicating whether the electronic circuit is in the active mode or the sleep mode, the first and second voltages being selectively supplied to the power switch transistor in accordance with the enable signal.

30. The apparatus of claim 29, wherein the means for biasing the gate region of the power switch transistor comprises means for providing the enable signal to buffering means and the buffering means providing the first voltage to the power switch transistor gate region.

31. The apparatus of claim 26, wherein the power switch is a headswitch or a footswitch.

32. The apparatus of claim 26, wherein the first voltage is a higher voltage than the second voltage.

33. The apparatus of claim 26, wherein the first voltage is a lower voltage than the second voltage.

34. The apparatus of claim 26, further comprising:
means for supplying a third voltage to a second power switch transistor during the active mode of the electronic circuit and a fourth voltage to the power switch transistor during the sleep mode of the electronic circuit, the second power switch transistor selectively coupling or decoupling the third voltage or the fourth voltage to a logic portion of the electronic circuit;
means for biasing a bulk region of the second power transistor using the third voltage during the sleep mode and the active mode; and
means for biasing a gate region of the second power transistor using the third voltage during the sleep mode.

35. The apparatus of claim 34, wherein the first voltage is a higher voltage than the second voltage, and the third voltage is a lower voltage than the fourth voltage.

36. The apparatus of claim 26, further comprising an electronic device, selected from the group consisting of a set top box, music player, video player, entertainment unit, navigation device, communications device, personal digital assistant (PDA), fixed location data unit, and a computer, into which the apparatus for reducing leakage in an electronic circuit is integrated.

37. The apparatus of claim 26, wherein the first and second voltages are supplied to a drain region of the power switch transistor.

38. The apparatus of claim 26, wherein at least a part of the apparatus is integrated in a semiconductor die.

39. A method for reducing leakage in an electronic circuit, comprising:
step for supplying a first voltage to a power switch transistor during an active mode of the electronic circuit and a second voltage to the power switch transistor during a sleep mode of the electronic circuit, the power switch transistor selectively coupling or decoupling the first voltage or the second voltage to a logic portion of the electronic circuit;
step for biasing a bulk region of the power switch transistor using the first voltage during the sleep mode and the active mode; and
step for biasing a gate region of the power switch transistor using the first voltage during the sleep mode.

40. The method of claim 39, wherein the electronic circuit is a CMOS circuit.

41. The method of claim 39, wherein the first and second voltages are supplied to a source region of the power switch transistor.

42. The method of claim 39, further comprising step for generating an enable signal indicating whether the electronic circuit is in the active mode or the sleep mode, the first and second voltages being selectively supplied to the power switch transistor in accordance with the enable signal.

43. The method of claim 42, wherein the step for biasing the gate region of the power switch transistor comprises step for providing the enable signal to a buffer and the buffer providing the first voltage to the power switch transistor gate region.

44. The method of claim 39, wherein the power switch is a headswitch or a footswitch.

45. The method of claim 39, wherein the first voltage is a higher voltage than the second voltage.

46. The method of claim 39, wherein the first voltage is a lower voltage than the second voltage.

47. The method of claim 39, further comprising:
step for supplying a third voltage to a second power switch transistor during the active mode of the electronic circuit and a fourth voltage to the power switch transistor during the sleep mode of the electronic circuit, the second power switch transistor selectively coupling or decoupling the third voltage or the fourth voltage to a logic portion of the electronic circuit;
step for biasing a bulk region of the second power transistor using the third voltage during the sleep mode and the active mode; and
step for biasing a gate region of the second power transistor using the third voltage during the sleep mode.

48. The method of claim 47, wherein the first voltage is a higher voltage than the second voltage, and the third voltage is a lower voltage than the fourth voltage.

49. The method of claim 39, further comprising the step for applying the method for reducing leakage in an electronic circuit in an electronic device, selected from the group consisting of a set top box, music player, video player, entertainment unit, navigation device, communications device, personal digital assistant (PDA), fixed location data unit, and a computer.

50. The method of claim 39, wherein the first and second voltages are supplied to a drain region of the power switch transistor.

51. A non-transitory computer-readable medium, comprising instructions stored thereon that, if executed by a lithographic device, cause the lithographic device to fabricate at least a part of a device, comprising:
a power switch transistor configured to selectively couple or decouple a supply voltage to a logic portion of the electronic circuit, the power switch transistor receiving a first voltage as the supply voltage during an active mode of the electronic circuit and receiving a second voltage as the supply voltage during a sleep mode of the electronic circuit, wherein
the power switch transistor comprises a bulk region that is configured to be biased using the first voltage during the sleep mode and the active mode, and
the power switch transistor comprises a gate region that is configured to be biased using the first voltage during the sleep mode.

52. The non-transitory computer-readable medium of claim 51, wherein the electronic circuit is a CMOS circuit.

53. The non-transitory computer-readable medium of claim 51, wherein the first and second voltages are received at a source region of the power switch transistor.

54. The non-transitory computer-readable medium of claim 51, wherein the first and second voltages are selectively received by the power switch transistor according to an enable signal indicating whether the electronic circuit is in the active mode or the sleep mode.

55. The non-transitory computer-readable medium of claim 54, wherein the power switch transistor gate region is biased using a buffer receiving the enable signal and providing the first voltage to the power switch transistor gate region.

56. The non-transitory computer-readable medium of claim 51, wherein the power switch is a headswitch or a footswitch.

57. The non-transitory computer-readable medium of claim 51, wherein the first voltage is a higher voltage than the second voltage.

58. The non-transitory computer-readable medium of claim 51, wherein the first voltage is a lower voltage than the second voltage.

59. The non-transitory computer-readable medium of claim 51, further comprising instructions stored thereon that, if executed by a lithographic device, cause the lithographic device to fabricate at least a part of a device, comprising:
a second power switch transistor configured to selectively couple or decouple a second supply voltage to the logic portion of the electronic circuit, the power switch transistor receiving a third voltage during the active mode of the electronic circuit and receiving a fourth voltage during the sleep mode of the electronic circuit, wherein
the second power switch transistor comprises a second bulk region that is biased using the third voltage during the sleep mode, and
the power switch transistor comprises a gate region that is biased using the third voltage during the sleep mode.

60. The non-transitory computer-readable medium of claim 59, wherein the first voltage is a higher voltage than the second voltage, and the third voltage is a lower voltage than the fourth voltage.

* * * * *